(12) United States Patent
Tanaka

(10) Patent No.: US 6,512,276 B1
(45) Date of Patent: Jan. 28, 2003

(54) SEMICONDUCTOR MEMORY HAVING AN IMPROVED CELL LAYOUT

(75) Inventor: Takao Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/624,888

(22) Filed: Jul. 24, 2000

(30) Foreign Application Priority Data

Jul. 23, 1999 (JP) ............................................ 11-209328

(51) Int. Cl.[7] .......................... H01L 29/76; H01L 29/94; H01L 31/062; H01L 31/113; H01L 31/119
(52) U.S. Cl. ........................ 257/390; 257/905; 257/907
(58) Field of Search ................................ 257/296, 390, 257/905, 907

(56) References Cited

U.S. PATENT DOCUMENTS

| | | | | |
|---|---|---|---|---|
| 5,247,197 A | * | 9/1993 | Ema | 257/296 |
| 5,583,358 A | * | 12/1996 | Kimura et al. | 257/306 |
| 5,812,443 A | * | 9/1998 | Lee et al. | 365/149 |
| 5,821,592 A | * | 10/1998 | Hoenigschmid et al. | 257/390 |
| 6,097,621 A | * | 8/2000 | Mori | 365/63 |
| 6,194,767 B1 | * | 2/2001 | An | 257/390 |

FOREIGN PATENT DOCUMENTS

| | | |
|---|---|---|
| JP | 61-288464 | 12/1986 |
| JP | 4-348071 | * 12/1992 |

* cited by examiner

*Primary Examiner*—Ngân V. Ngô
(74) *Attorney, Agent, or Firm*—McGinn & Gibb, PLLC

(57) ABSTRACT

In a mask ROM, bit lines 1 composed of a diffused region formed in a semiconductor substrate are formed in such a zigzag pattern that in a region where each of the bit lines overlaps word lines 2 formed of a patterned conductive film formed on an oxide film covering the diffused region of the bit lines 1, the bit line is perpendicular to the word lines, and in a region where each of the bit lines does not overlap the word lines, the bit line has a predetermined angle to the word lines, with the result that channel regions of memory cell transistors are located in a checker pattern. Thus, it is possible to minimize influence of a code ion implanted impurity diffused region 3A to a low-threshold memory cell transistor C.

19 Claims, 4 Drawing Sheets

- 1 BIT LINE
- 2 WORD LINE
- C CELL TO BE NOTED
- 3A CODE ION IMPLANTED IMPURITY DIFFUSED REGION

- 4 PHOTORESIST FOR MASKING CODE ION IMPLANTATION
- WORD LINE 2
- 6 OXIDE FILM
- 6A OXIDE FILM
- 5 SEMICONDUCTOR SUBSTRATE
- 3A CODE ION IMPLANTED IMPURITY DIFFUSED REGION

SEMICONDUCTOR MEMORY HAVING AN IMPROVED CELL LAYOUT

BACKGROUND OF THE INVENTION

The present invention relates to a semiconductor memory such as a mask ROM (read only memory), and more specifically to a mask ROM having an improved cell layout which can minimize an influence of implanted code ions to an adjacent cell.

The mask ROM can be explained to be a ROM which was written with a predetermined content by utilizing a mask pattern in the course of an IC (integrated circuit) fabricating process.

In this mask ROM, a read-out data is generally handled as data having two values, namely, "0" and "1". These two values are expressed as an on-bit and an off-bit in a flat cell type ROM. On the other hand, considering a threshold of a memory cell transistor, the on-bit and the off-bit are represented by a transistor having a low threshold and a transistor having a high threshold, respectively.

As a method for forming the low-threshold transistor and the high-threshold transistor, distinguishably from each other, the flat cell type ROM includes a method for selectively implanting boron, as an ion implantation impurity, in accordance with a content that is to be written in a mask ROM in the course of the IC fabricating process. This ion implantation is called a "code ion implantation" in the field of the ROM.

Japanese Patent Application Pre-examination Publication No. JP-A61-288464 discloses one example of a cell layout of the flat cell type ROM which was fabricated in accordance with the method capable of forming the low-threshold transistor and the high-threshold transistor, distinguishably from each other. Now, the prior art disclosed by JP-A61-288464 will be described with reference to FIGS. 5 to 8.

FIG. 5 is a diagrammatic plan view for illustrating the cell layout in accordance with the prior art, and FIG. 6 is a diagrammatic sectional view taken along the line A—A in FIG. 5.

As shown in FIGS. 5 and 6, in the prior art, a plurality of bit lines 1, which become a source region and a drain region of memory cell transistors, are formed of N-type diffused regions 1A which are formed in a principal surface of a semiconductor substrate 5 to extend in parallel to one another, separately from one another. A plurality of word lines 2 are formed on an insulating film 6A formed on the principal surface of a semiconductor substrate 5, to extend in parallel to one another, separately from one another, and orthogonally to the bit lines. This arrangement is a so-called flat cell.

In a flat cell ROM fabricating process, after a gate electrode constituting each word line 2 is formed, a P-type impurity is ion-implanted for a device isolation so that a P-type impurity diffused region (not shown in FIG. 6) is formed. Furthermore, an oxide film 6 is deposited to form an interlayer insulator film which covers the word lines 2 and the semiconductor substrate. Thereafter, a photolithography step is carried out for depositing a photoresist 4 for a ROM coding. Thus, the flat cell having the sectional structure shown in FIG. 6 is obtained.

In this condition, code ion implanting openings 3 formed in the photoresist 4 are designed in the prior art to have the same width as a channel width of the memory cell transistor, as shown in FIG. 5. However, since the code ion implantation is carried out after the interlayer insulator film 5 was formed, the energy required for the code ion implantation becomes high.

For example, in the case that a gate polycide constituting the word lines 2 is formed of a polysilicon of 0.1 $\mu$m thickness and a tungsten silicide of 0.15 $\mu$m thickness, and an interlayer film has a thickness of 0.3 $\mu$m to 0.4 $\mu$m, when boron is used a dopant, the code ion implantation requires an energy as high as 200 keV to 350 keV.

Therefore, if the code ion implantation is carried out using the cell layout disclosed by JP-A-61-288464 after the interlayer film was formed, since the ion implantation is carried with a high energy, a code ion implanted impurity diffused region 3A (shown in FIGS. 7 and 8) becomes large in comparison with the case that, in a condition that the interlayer film has not yet been formed, the ion implantation is carried with an energy on the order of 100 kev to 150 keV. As a result, an effective channel width under an adjacent word line, namely, of an adjacent cell transistor, becomes narrow.

Now, the above mentioned influence will be described with reference to FIG. 7, which is a diagrammatic plan view for illustrating the spread of the impurity diffused region by the reference number 3A when the ion implantation is carried with the high energy in the prior art cell layout.

In FIG. 7, a cell "C" to be noted is shown at the same position as that shown in FIG. 5. This cell "C" to be noted is an on-bit cell, so that no boron ion is ion-implanted into the cell "C" to be noted, and on the other hand, the code ion implantation is carried out for eight cells adjacent to the on-bit cell "C" in eight directions. In the condition shown in FIG. 7, the influence of the adjacent cells to the on-bit cell "C" is the worst.

This would be seen from FIG. 8, which is a diagrammatic sectional view taken along the line B—B in FIG. 7. As shown in FIG. 8, an effective channel width of the on-bit cell "C" is narrowed by the spread of the boron (the code ions) from an upper cell adjacent to the on-bit cell "C" and the spread of the boron (the code ions) from a lower cell adjacent to the on-bit cell "C". As a result, the threshold of the on-bit cell "C" adversely becomes higher than a primarily expected threshold. This means that a reading margin of the cell in the mask ROM becomes small.

Here, it is considered to carry out the code ion implantation after the gate silicide (word line) is formed but before the interlayer film is formed, so that the code ion can be ion-implanted with a reduced energy. However, since it is strongly required to shorten a so-called TAT (turn around time) after a ROM coding data is given from a customer before a product is shipped to the customer, it is necessary to make the step of the code ion implantation as late as possible. Therefore, it is not practically acceptable to carry out the code ion implantation before the interlayer film is formed.

BRIEF SUMMARY OF THE INVENTION

Accordingly, it is an object of the present invention to provide a semiconductor memory which has overcome the above mentioned problems of the prior art.

Another object of the present invention is to provide a semiconductor read only memory of the flat cell structure having a large reading margin by preventing the threshold of an on-bit cell (with no code ion implantation) from becoming high because of the influence of the spread of the code ions from adjacent cells.

According to the prevent invention, there is provided a semiconductor memory wherein bit lines are formed to have a predetermined angle to word lines.

According to the prevent invention, there is also provided a semiconductor memory wherein in a region where each bit line overlaps word lines, the bit line is perpendicular to the word lines, and in a region where each bit line does not overlap the word lines, the bit line has a predetermined angle to the word lines According to the prevent invention, there is also provided a semiconductor memory comprising:

- a plurality of bit lines formed by implanting a first impurity into a first predetermined region on a semiconductor substrate;
- a first oxide film formed to cover the bit lines and the semiconductor substrate;
- a plurality of word lines formed of a patterned polycide film composed of a polysilicon layer deposited on the first oxide film and doped with a second impurity and a silicide layer deposited on the polysilicon layer; and
- a high-threshold transistor formed by implanting code ions into a second predetermined region on the semiconductor substrate,
- wherein the bit lines are formed to have a predetermined angle to the word lines.

According to the prevent invention, there is also provided a semiconductor memory comprising:

- a plurality of bit lines formed by implanting a first impurity into a first predetermined region on a semiconductor substrate;
- a first oxide film formed to cover the bit lines and the semiconductor substrate;
- a plurality of word lines formed of a patterned polycide film composed of a polysilicon layer deposited on the first oxide film and doped with a second impurity and a silicide layer deposited on the polysilicon layer; and
- a high-threshold transistor formed by implanting code ions into a second predetermined region on the semiconductor substrate,
- wherein in a region where each of the bit lines overlaps the word lines, the bit line is perpendicular to the word lines, and in a region where each of the bit lines does not overlap the word lines, the bit line has the predetermined angle to the word lines.

According to the prevent invention, in the above mentioned semiconductor memories, the predetermined angle is an angle that minimizes an overlapping between a diffused region of the code ions and a region which is not implanted with the code ions and where the bit line does not overlap the word line.

According to the prevent invention, in the above mentioned semiconductor memories, the predetermined angle is an angle ensuring that a diffused region of the code ions does not overlap a region which is not implanted with the code ions and where the bit line does not overlap the word line.

According to the prevent invention, in the above mentioned semiconductor memories, the predetermined angle is 30 degrees.

According to the prevent invention, in the above mentioned semiconductor memories, the predetermined angle is an angle depicting a regular hexagon by a line which imaginarily connects respective centers of six overlapping regions of the bit lines and the word lines, all of the six overlapping regions having the same configuration and being adjacent to the same overlapping region of the bit line and the word line.

According to the prevent invention, in the above mentioned semiconductor memories, the word lines are in the form of stripes located in parallel to one another on the first oxide film formed on the semiconductor substrate.

According to the prevent invention, in the above mentioned semiconductor memories, the first predetermined region is in the form of stripes formed in the semiconductor substrate in parallel to one another and to have a predetermined width.

According to the prevent invention, in the above mentioned semiconductor memories, the second predetermined region is formed of a region in which the code ions implanted in accordance with a code to be written are diffused and which has, as its center, a center of the region which is positioned under the word line and in which the word line and the first predetermined region do not overlap each other.

According to the prevent invention, in the above mentioned semiconductor memories, the bit lines are formed of $N^+$ diffused regions.

According to the prevent invention, the above mentioned semiconductor memory further includes an impurity diffused region of a predetermined threshold, formed by implanting a third impurity into the semiconductor substrate for controlling a threshold of a memory cell transistor.

According to the prevent invention, in the above mentioned semiconductor memories, the predetermined threshold is lower than a threshold of the high-threshold transistor.

According to the prevent invention, in the above mentioned semiconductor memories, the semiconductor substrate is a P-type silicon substrate.

According to the prevent invention, in the above mentioned semiconductor memories, the first impurity is arsenic.

According to the prevent invention, in the above mentioned semiconductor memories, the polysilicon layer is formed on the first oxide film by a chemical vapor deposition process.

According to the prevent invention, in the above mentioned semiconductor memories, the second impurity is a high concentration of phosphorus.

According to the prevent invention, in the above mentioned semiconductor memories, the silicide is a silicide of a refractory metal.

According to the prevent invention, in the above mentioned semiconductor memories, the silicide is deposited on the polysilicon layer by a sputtering.

According to the prevent invention, there is also provided a method for fabricating a semiconductor memory wherein bit lines are formed to have a predetermined angle to word lines.

According to the prevent invention, there is also provided a method for fabricating a semiconductor memory, wherein in a region where each bit line overlaps word lines, the bit line is perpendicular to the word lines, and in a region where each bit line does not overlap the word lines, the bit line has the predetermined angle to the word lines.

According to the prevent invention, there is also provided a method for fabricating a semiconductor memory comprising the steps:

- implanting a first impurity into a first predetermined region on a semiconductor substrate, to form a plurality of bit lines formed of an impurity diffused region;
- forming a first oxide film to cover the bit lines formed of the impurity diffused region and the semiconductor substrate;
- forming a polysilicon layer on the first oxide film;
- implanting a second impurity into a second predetermined region on the polysilicon layer;
- forming a silicide layer on the polysilicon layer doped with the second impurity;

forming a first photoresist film having a first predetermined shape on a polycide film composed of the polysilicon layer and the silicide layer;

selectively removing the polycide film by a reactive etching using the first photoresist film as a mask, to form a plurality of word lines formed of a patterned polycide film;

removing the first photoresist film;

forming a second oxide film to cover the word lines;

forming a second photoresist film having a second predetermined shape on the second oxide film; and implanting code ions into the semiconductor substrate by using the second photoresist film as a mask, so that a high-threshold transistor is formed by the code ions implanted in a third predetermined region that is not masked by the second photoresist film, wherein the bit lines formed of the impurity diffused region are formed to have a predetermined angle to the word lines.

According to the prevent invention, there is also provided a method for fabricating a semiconductor memory comprising the steps:

implanting a first impurity into a first predetermined region on a semiconductor substrate, to form a plurality of bit lines formed of an impurity diffused region;

forming a first oxide film to cover the bit lines formed of the impurity diffused region and the semiconductor substrate;

forming a polysilicon layer on the first oxide film;

implanting a second impurity into a second predetermined region on the polysilicon layer;

forming a silicide layer on the polysilicon layer doped with the second impurity;

forming a first photoresist film having a first predetermined shape on a polycide film composed of the polysilicon layer and the silicide layer;

selectively removing the polycide film by a reactive etching using the first photoresist film as a mask, to form a plurality of word lines formed of a patterned polycide film;

removing the first photoresist film;

forming a second oxide film to cover the word lines;

forming a second photoresist film having a second predetermined shape on the second oxide film; and implanting code ions into the semiconductor substrate by using the second photoresist film as a mask, so that a high-threshold transistor is formed by the code ions implanted in a third predetermined region that is not masked by the second photoresist film, wherein in a region where each of the bit lines overlaps the word lines, the impurity diffused region constituting the bit line is formed perpendicular to the word lines, and in a region where each of the bit lines does not overlap the word lines, the impurity diffused region constituting the bit line is formed to have the predetermined angle to the word lines.

According to the present invention, in the above mentioned methods for fabricating the semiconductor memory, the predetermined angle is an angle that minimizes an overlapping between a diffused region of the code ions implanted by the code ion implanting step and a region which is not implanted with the code ions and where the bit line does not overlap the word line According to the present invention, in the above mentioned methods for fabricating the semiconductor memory, the predetermined angle is an angle ensuring that a diffused region of the code ions implanted by the code ion implanting step does not overlap a region which is not implanted with the code ions and where the bit line does not overlap the word line.

According to the present invention, in the above mentioned methods for fabricating the semiconductor memory, the predetermined angle is 30 degrees.

According to the present invention, in the above mentioned methods for fabricating the semiconductor memory, the predetermined angle is an angle depicting a regular hexagon by a line which imaginarily connects respective centers of six overlapping regions of the bit lines and the word lines, all of the six overlapping regions having the same configuration and being adjacent to the same overlapping region of the bit line and the word line.

According to the present invention, in the above mentioned methods for fabricating the semiconductor memory, the first predetermined region is formed in the form of stripes in the semiconductor substrate in parallel to one another and to have a predetermined width.

According to the present invention, in the above mentioned methods for fabricating the semiconductor memory, the third predetermined region is a region in which the code ions are to be implanted in accordance with a code to be written and which has, as its center, a center of the region which is positioned under the word line and in which the word line and the first predetermined region do not overlap each other.

According to the present invention, in the above mentioned methods for fabricating the semiconductor memory, the impurity diffused region constituting the bit lines is formed of an $N^+$ diffused region.

According to the present invention, the above mentioned method for fabricating a semiconductor memory further includes, before the step of implanting the first impurity, the step of implanting a third impurity into the semiconductor substrate for controlling a threshold of a memory cell transistor, to form an impurity diffused region of a predetermined threshold.

According to the present invention, in the above mentioned methods for fabricating the semiconductor memory, the word lines are located in the form of stripes in parallel to one another on the first oxide film formed on the semiconductor substrate.

According to the present invention, in the above mentioned methods for fabricating the semiconductor memory, the predetermined threshold is lower than a threshold of the high-threshold transistor.

According to the present invention, in the above mentioned methods for fabricating the semiconductor memory, the semiconductor substrate is a P-type silicon substrate.

According to the present invention, in the above mentioned methods for fabricating the semiconductor memory, the first impurity is arsenic.

According to the present invention, in the above mentioned methods for fabricating the semiconductor memory, the polysilicon layer is formed on the first oxide film by a chemical vapor deposition process.

According to the present invention, in the above mentioned methods for fabricating the semiconductor memory, the second impurity is a high concentration of phosphorus.

According to the present invention, in the above mentioned methods for fabricating the semiconductor memory, the silicide is a silicide of a refractory metal.

According to the present invention, in the above mentioned methods for fabricating the semiconductor memory, the silicide is deposited on the polysilicon layer by a sputtering.

With the above mentioned arrangement, the cell layout is improved in accordance with the present invention to minimize the influence of the spread of the code ions implanted for the mask ROM, from a code ion implanted cell to an adjacent cell to which the code ions were not implanted.

In brief, with the above mentioned cell layout in accordance with the present invention, channel regions of memory cells are resultantly located in a checker pattern. Therefore, the influence of the spread of the code ions implanted by the code ion implantation and caused by its succeeding heat treatment, to an adjacent cell, can be minimized.

Specifically, in a flat cell type mask ROM, the influence of the code ions to the adjacent cell means that the code ions are diffused from the code ion implanted cell to an adjacent cell to which the code ions were not implanted, with the result that the threshold of the cell to which the code ions were not implanted, changes. In the case that boron is used as the impurity for the code ion implantation in the flat cell type ROM, the change of the threshold results in an elevated threshold, with the result that the reading margin becomes small. This problem has been overcome by the cell layout in accordance with the present invention.

The above and other objects, features and advantages of the present invention will be apparent from the following description of preferred embodiments of the invention with reference to the accompanying drawings.

DETAILED DESCRIPTION OF THE INVENTION

Figure 1:
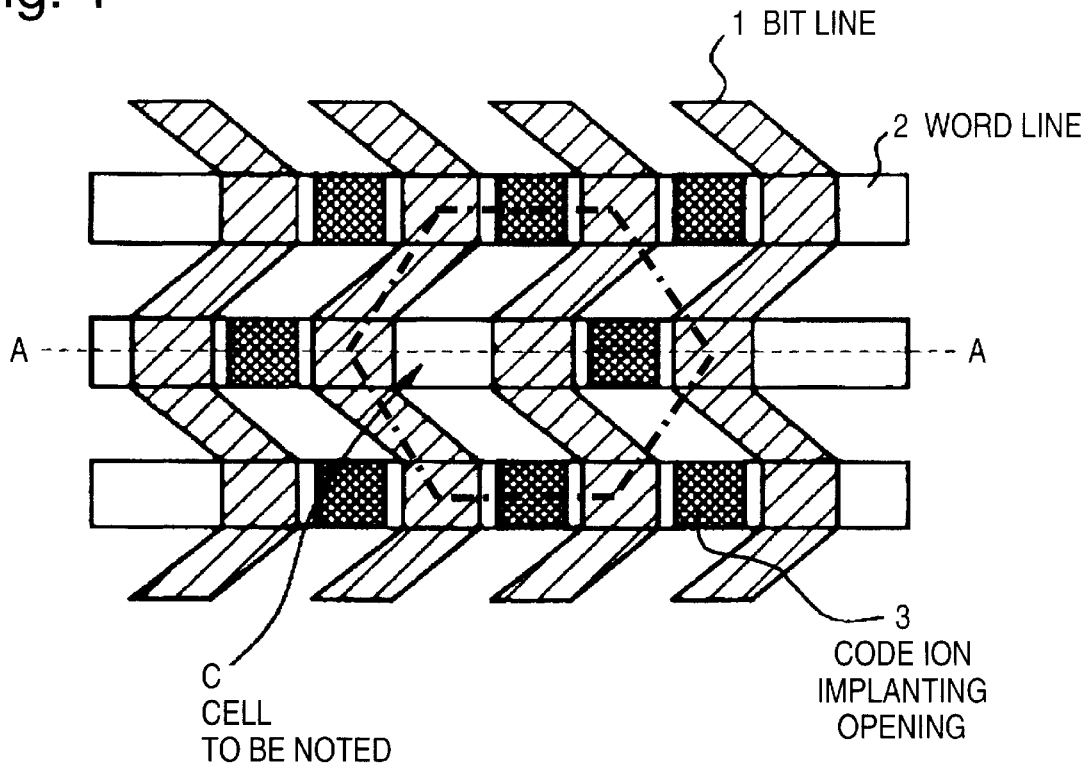
FIG. 1 is a diagrammatic plan view for illustrating the cell layout in the semiconductor memory in accordance with the present invention.
Figure 2:
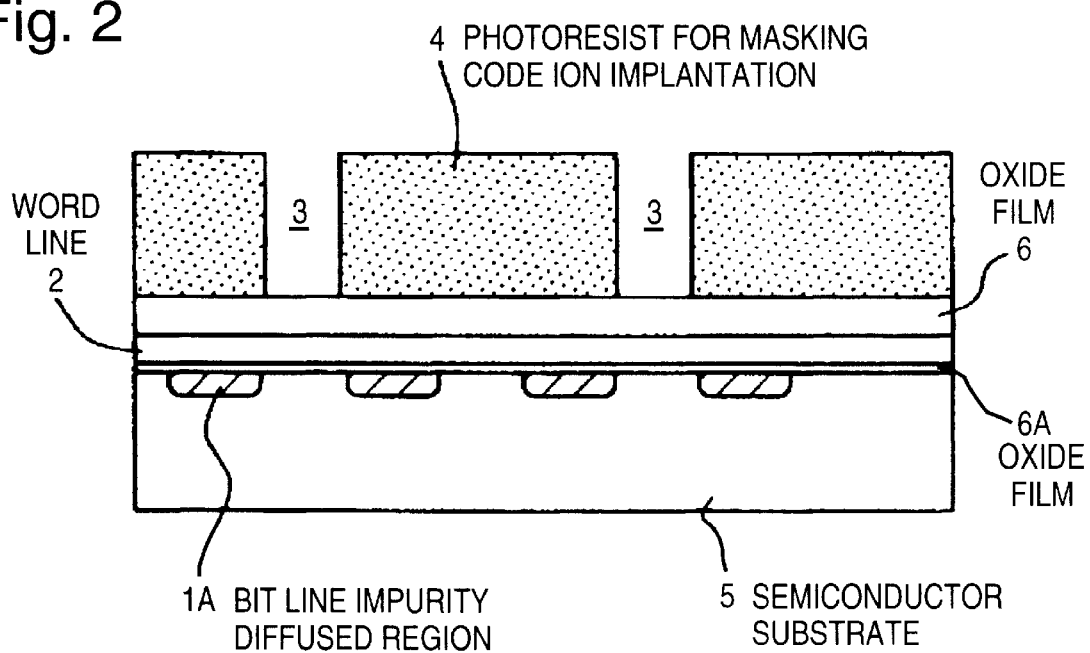
FIG. 2 is a diagrammatic sectional view taken along the line A—A in FIG. 2.
Figure 3:
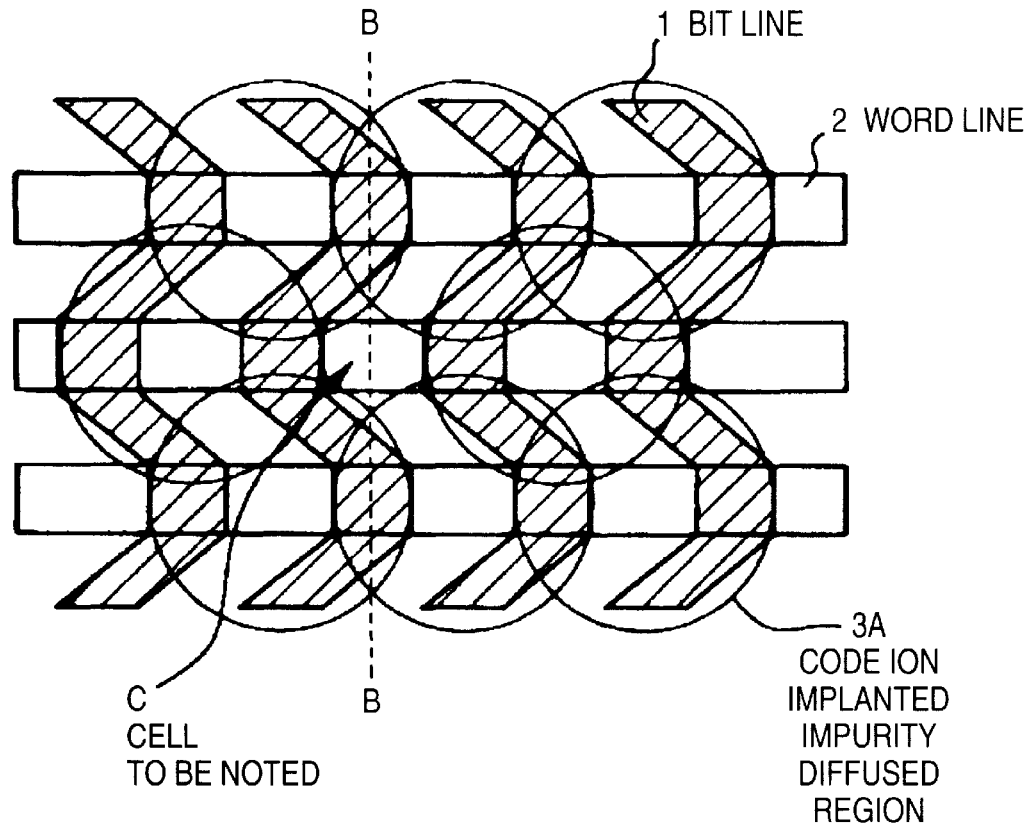
FIG. 3 is a diagrammatic plan view for illustrating the spread of the impurity diffused region when the ion implantation is carried with the high energy in the cell layout in accordance with the present invention.
Figure 4:
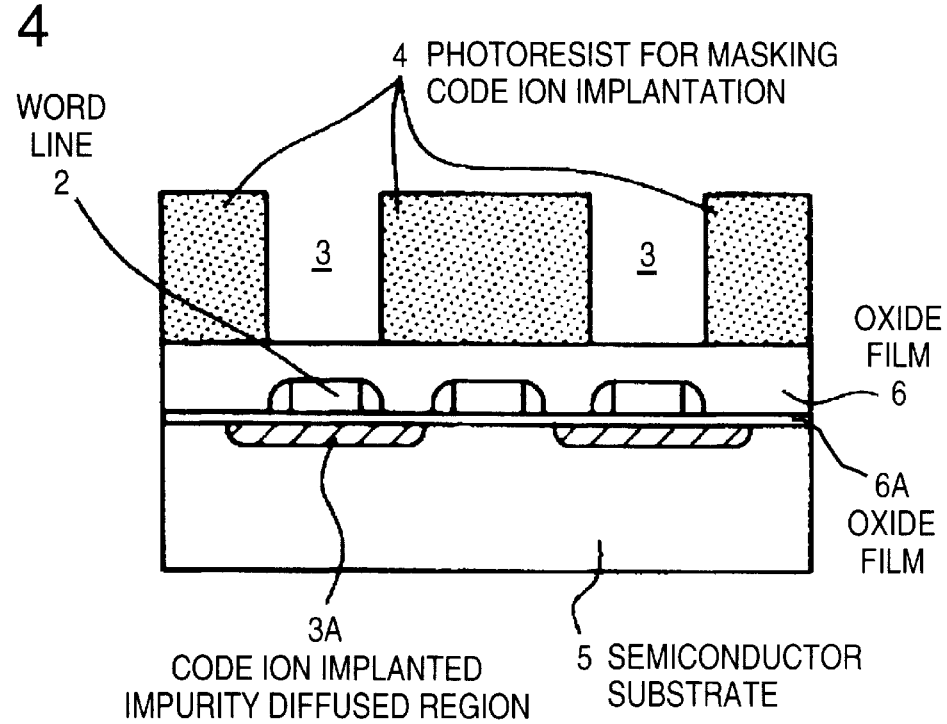
FIG. 4 is a diagrammatic sectional view taken along the line B—B in FIG. 3.

Now, an embodiment of the semiconductor memory in accordance with the present invention will be described with reference to FIGS. 1 to 4. In FIGS. 1 to 4, elements corresponding in function to those shown in FIGS. 5 to 8 are given the references numbers, and explanation will be omitted to a possible extent. FIG. 1 is a diagrammatic plan view for illustrating the cell layout in the flat cell type ROM which is an embodiment of the semiconductor memory in accordance with the present invention. In FIG. 1, however, a selection line for the bit lines and a metal interconnection are omitted for simplification of the drawing. FIG. 2 is a diagrammatic sectional view taken along the line A—A in FIG. 2 after a patterned photoresist film having a number of code ion implantation openings is formed in the photolithography step. FIG. 3 is a diagrammatic plan view for illustrating the spread of the impurity diffused region when the code ion implantation is carried with the high energy in the cell layout in accordance with the present invention. In FIG. 3, the reference sign "C" designates a cell to be noted, to which the code ions are not to be implanted, and the code ions are to be implanted to six cells adjacent to the cell "C" to be noted, in six directions radially outward extending from the cell "C" to be noted. FIG. 4 is a diagrammatic sectional view taken along the line B—B in FIG. 3.

As shown in FIGS. 1 and 2, a plurality of bit lines 1 are formed of N-type diffused regions 1A formed in a principal surface of a semiconductor substrate 5 in the form of stripes which extend to depict a zigzag pattern, in parallel to one another, but separately from one another. A plurality of word lines 2 are formed on an insulating film 6A formed on the principal surface of a semiconductor substrate 5, in the form of stripes which straight extend in parallel to one another, separately from one another, and orthogonally to the direction of the whole of the bit lines. As a result, in a region where each of the bit lines 1 overlaps the word lines 2, the bit line is perpendicular to the word lines, and on the other hand, in a region where each of the bit lines 1 does not overlap the word lines 2, the bit line has a predetermined angle to the word lines.

After the word lines 2 are formed, a P-type impurity is ion-implanted for a device isolation between memory cells so that a P-type impurity diffused region (not shown) is formed, in a self alignment to the bit lines 1 and the word lines 2, in the principal surface of a semiconductor substrate 5 excluding the bit lines 1 and the word lines 2. In this structure, each memory cell transistor has a gate length corresponding to a spacing between each pair of adjacent bit lines 2, and a gate width corresponding to the width of the word line 2.

Figure 5:
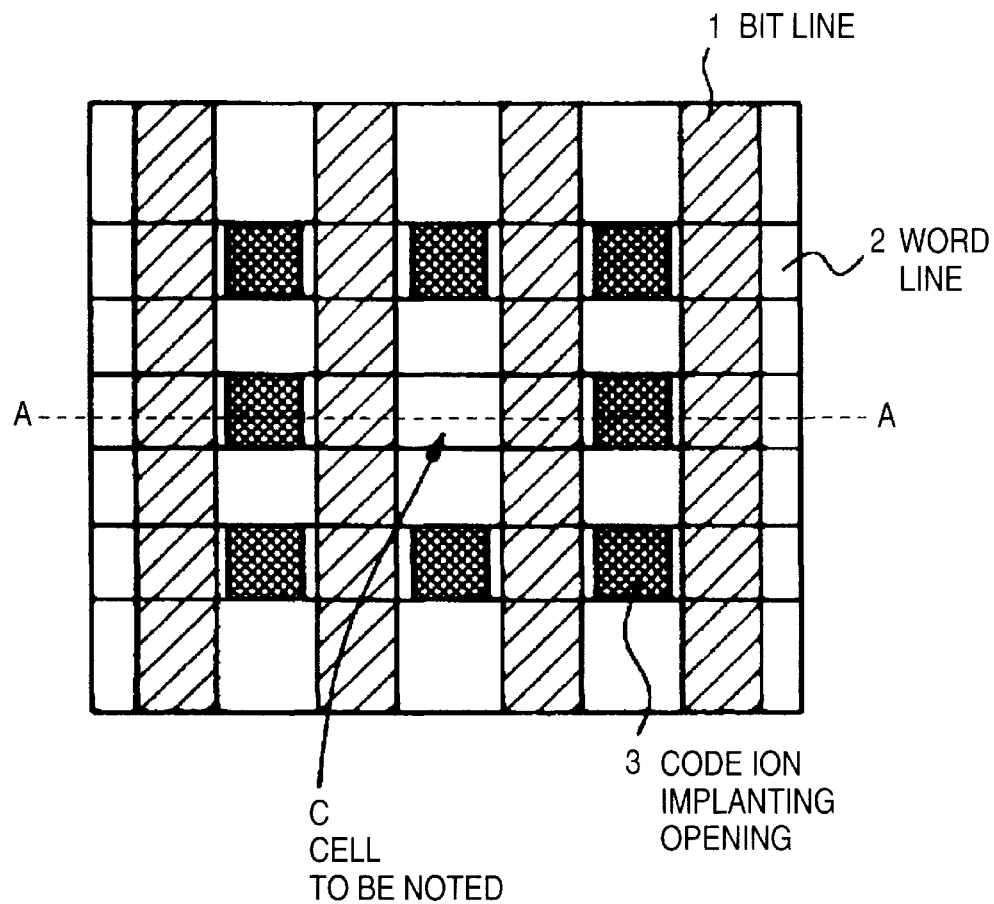
FIG. 5 is a diagrammatic plan view for illustrating the cell layout in accordance with the prior art.
Figure 6:
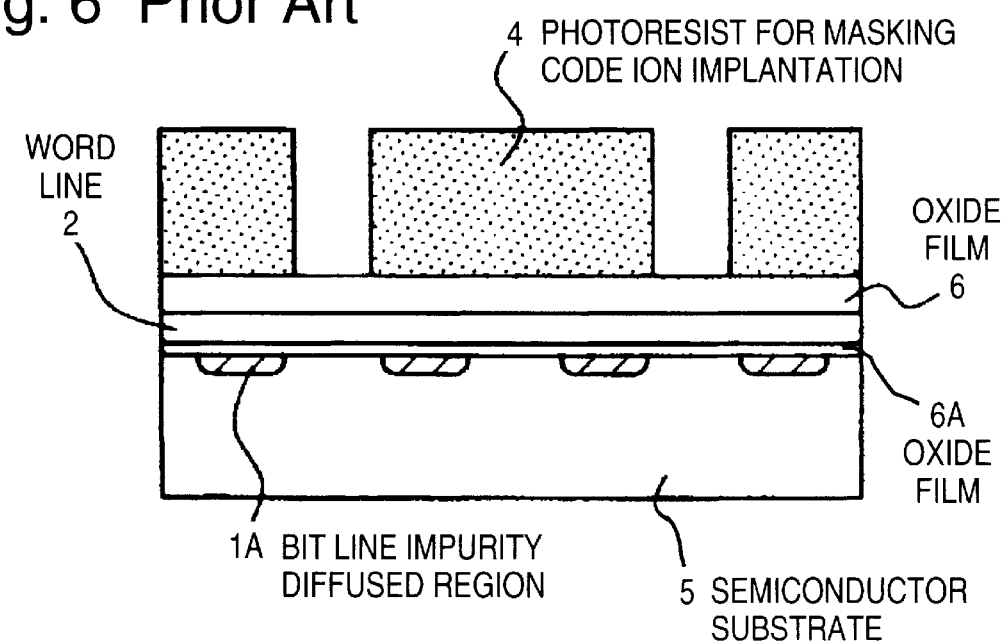
FIG. 6 is a diagrammatic sectional view taken along the line A—A in FIG. 5.
Figure 7:
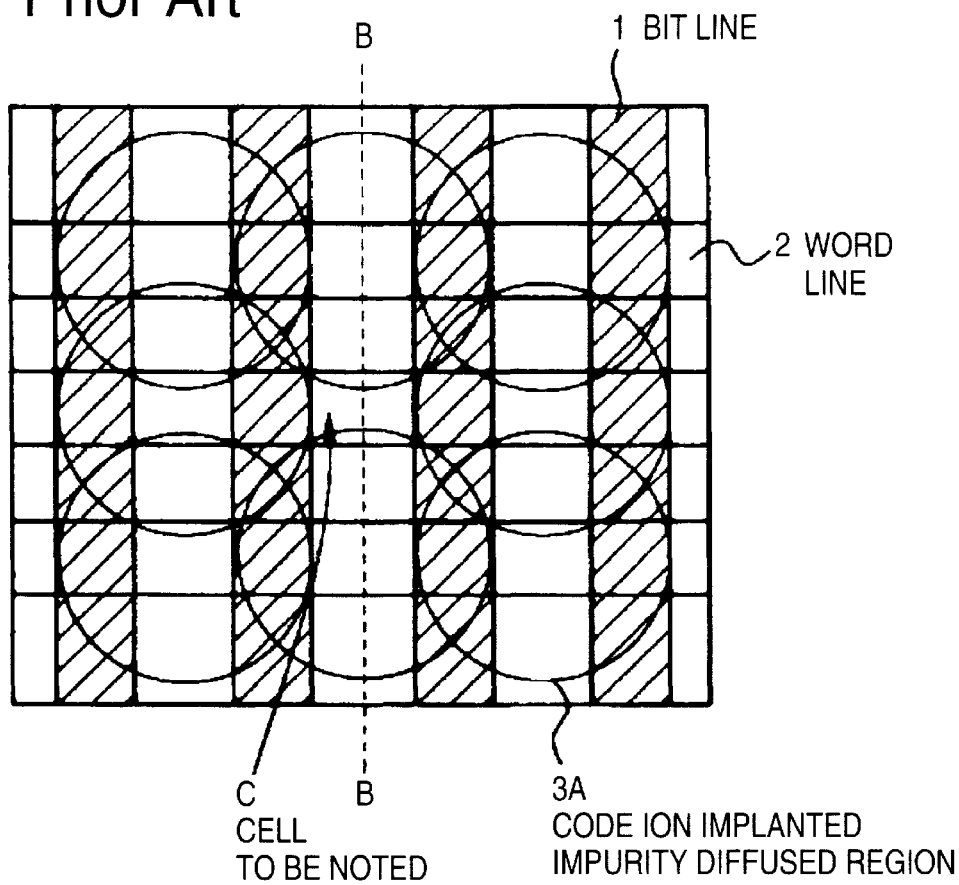
FIG. 7 is a diagrammatic plan view for illustrating the spread of the impurity diffused region when the ion implantation is carried with the high energy in the prior art cell layout.
Figure 8:
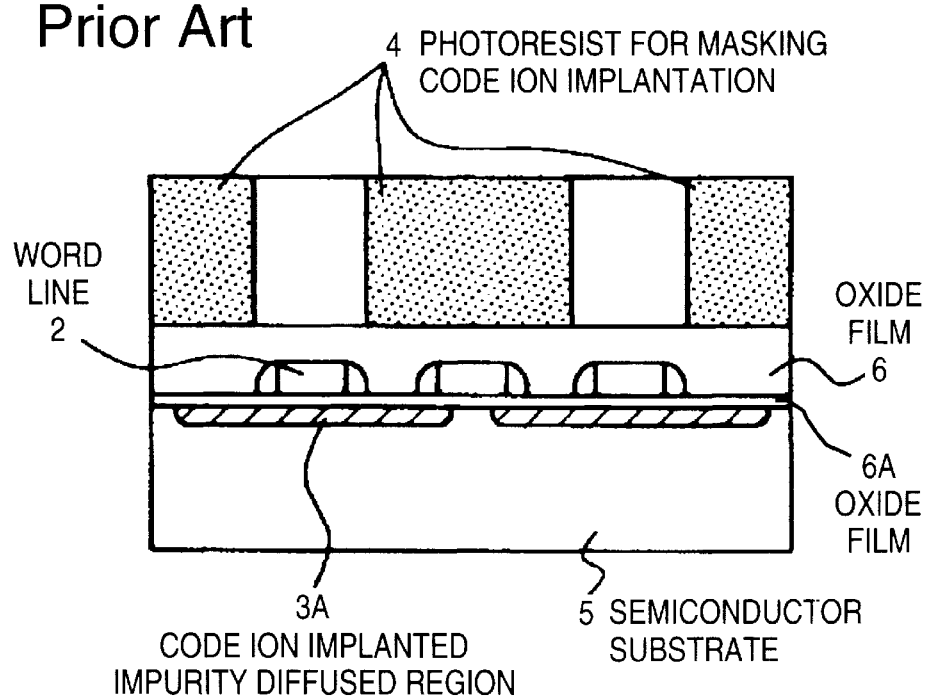
FIG. 8 is a diagrammatic sectional view taken along the line B—B in FIG. 7.

In the prior art cell layout shown in FIG. 5, the code ion implanting openings 3, which determine the read-out data of respective memory cells, are arranged in the form of a regular matrix. In the shown embodiment of the prevent invention, on the other hand, the code ion implanting openings 3 are arranged in a checker pattern. Namely, the channel regions in a column direction are alternatively deviated in a row direction.

After the photoresist 4 for the masking the code ion implantation, having the code ion implanting openings 3 as shown in FIG. 1 is formed on the oxide film 6 (interlayer insulator film) as shown in FIG. 2, code ions (for example, boron ions) are implanted into the semiconductor substrate 1 (for example, a P-type silicon substrate) for controlling the threshold of the memory cell transistors. As a result, by the code ion implantation and its succeeding heat treatment, the code ions are diffused and spread as shown by the reference number 3A in FIGS. 3 and 4. However, the channel region of the cell "C" to be noted (to which the code ions are not to be implanted) is not substantially narrowed by the six adjacent code ion implanted impurity diffused regions 3A.

Now, a specific embodiment will be described. Arsenic ions are selectively ion-implanted into zigzag-patterned predetermined regions of the principal surface of the P-type silicon substrate 5, under the energy of 40 to 70 keV and the dose of 7E14 to 3E15 cm$^{-2}$, so that N$^+$ diffused regions 1A are formed in the principal surface of the P-type silicon substrate 5. The N$^+$ diffused regions 1A constitute the bit lines 1.

Thereafter, as the gate oxide film 6A, an oxide film having a thickness of 5 to 15 nm is formed to cover the $N^+$ diffused regions 1A and the principal surface of the P-type silicon substrate 5. Then, a polysilicon film is deposited to have a thickness of 100 to 200 nm by a CVD (chemical vapor deposition) process, and succeedingly, phosphorus is doped into the polysilicon film so that a high concentration of phosphorus is diffused in the polysilicon film. Furthermore, a silicide film of a refractory metal is deposited to have a thickness of 100 to 200 nm by a sputtering.

A polycide film thus formed of the polysilicon film and the silicide film is patterned by a reactive ion etching using a patterned photoresist mask (not shown) having a predetermined shape formed on the polycide film, so that the word lines 2 formed of a gate electrode of the memory cells are formed on the gate oxide film 6A.

After the patterned photoresist mask is removed, an oxide film 6 having a thickness of 400 to 600 nm is deposited on the word lines 2 and the principal surface of the P-type silicon substrate 5, by a CVD process.

Thereafter, the patterned photoresist 4 having the code ion implanting openings 3 is formed on the oxide film 6, and then, as code ions, boron is ion-implanted into the principal surface of the P-type silicon substrate 5 with a high energy on the order of 200 to 350 keV. Succeedingly, a heat treatment is carried out if necessary. Thus, a high-threshold transistor is formed in each of regions that are not masked by the patterned photoresist 4, namely, that correspond to the code ion implanting openings 3. Since a succeeding process is similar to the prior art, further explanation will be omitted.

A mentioned above, the structure of the flat cell type ROM in accordance with the present invention is similar to that of the prior art flat cell type ROM, excluding the pattern of the bit lines and hence the mutual relation between the code ion implanted impurity diffused regions 3A and the channel region of the cell to which the code ions were not implanted.

Thus, in the flat cell type ROM in accordance with the present invention, the cell to which the code ions were not implanted can have a low threshold, and on the other hand, the cell to which the code ions were implanted can have a high threshold. Thus, data of "0" and "1" was written in the flat cell type ROM. Incidentally, although it is not indispensable, it is possible to ion-implant an impurity before the impurity for forming the bit lines is implanted, so that the cell to which the code ions were not implanted can have a desired low threshold.

As seen from the above, a fundamental difference between the present invention and the prior art is the cell layout. If the channel regions of the memory cells are arranged in the checker pattern as shown in FIG. 3, it is possible to minimize the variation of the threshold of the cell "C" to be noted (to which the code ions were not implanted), caused by the influence of the spread of the implanted code ions of the code ion implanted cells adjacent to the cell "C" to be noted in a direction perpendicular to the word line (in the vertical direction in FIG. 3).

As described in connection with the above mentioned embodiment, in the semiconductor memory in accordance with the present invention, since the bit lines are formed to have a predetermined angle to the word lines, it is possible to prevent the code ion implanted impurity diffused region from overlapping the channel region of the cell to which the code ions were not implanted.

Therefore, in order to surely achieve this advantage, it is considered to be preferred that an inclined angle between the bit line and the word line is 30 degrees. This mean that, considering overlapping regions of the bit lines and the word lines (the overlapping regions having the same configuration), a regular hexagon is depicted by a line which imaginarily connects respective centers of six overlapping regions which surround one overlapping region and are adjacent to the one overlapping region, as shown by a thick chain line in FIG. 1.

However, the above mentioned value is a mere example, and the inclined angle can have any value if it is possible to reduce the variation of the threshold of the low-threshold transistor caused by the code ion implanted impurity diffused region, to a level acceptable to a user.

In the above mentioned embodiment, the bit lines are formed in such a zigzag pattern that the channel regions of the memory cell transistors are arranged in the checker pattern. However, the present invention is in no way limited to this pattern of the bit lines. The bit lines can have any pattern if the code ion implanting openings can be located in a pattern that can minimize or nullify the influence of the code ion diffusion to a low-threshold transistor.

As seen from the above, the semiconductor memory in accordance with the prevent invention has such a cell layout that the memory cell transistors in the flat cell type ROM are located to depict for example the checker pattern. Thus, even if the code ions are implanted with a high energy after the interlayer insulator film is formed in order to shorten the TAT, the influence of the spread of the code ion implanted impurity diffused regions can be reduced in comparison with the prior art cell layout. Therefore, it is possible to reduce the variation of the threshold of the memory cell transistor to which the code ions were not implanted, with the result that it is possible to ensure a sufficient reading margin between a high-threshold memory cell to which the code ions were implanted and a low-threshold memory cell to which the code ions were not implanted.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor memory, comprising:
    a plurality of bit lines formed on a semiconductor substrate;
    a first oxide film formed over said plurality of bit lines and said semiconductor substrate; and
    a plurality of word lines formed on said first oxide film, wherein
        each of said plurality of bit lines has a first direction characteristic of a whole bit line that extends in a zigzag pattern,
        each of said plurality of word lines extends in a second direction that crosses said first direction,
        a first region is proximate to a crossing of one of said plurality of bit lines and one of said plurality of word lines, said first region being surrounded by a second region, which is proximate to a plurality of crossings of a plurality of nearest bit lines and a plurality of nearest word lines, and
        said second region is implanted with code ions.

2. A semiconductor memory claimed in claim 1, wherein at a crossing of each of said plurality of bit lines with one of said plurality of word lines, a line segment of each of said plurality of bit lines is perpendicular to said one of said plurality of word lines, and where another line segment of each of said plurality of bit lines does not cross one of said plurality of word lines, an acute angle to said one of said plurality of word lines is formed.

3. A semiconductor memory claimed in claim 2, wherein said acute angle minimizes an overlapping between a diffused region of said code ions and another region which is not implanted with said code ions.

4. A semiconductor memory claimed in claim 2, wherein said acute angle ensures that a diffused region of said code ions does not overlap a region which is not implanted with said code ions.

5. A semiconductor memory claimed in claim 2, wherein said acute angle is 30 degrees.

6. A semiconductor memory claimed in claim 2, wherein said acute angle results in said plurality of crossings forming a regular hexagon of said second region, and each of said plurality of crossings has the same configuration and is adjacent to said first region.

7. A semiconductor memory claimed in claim 1, wherein said plurality of word lines are in the form of stripes located in parallel to one another.

8. A semiconductor memory claimed in claim 1, wherein said plurality of bit lines is in the form of stripes in said zigzag pattern and each of said plurality of bit lines is in parallel to another and has a predetermined width.

9. A semiconductor memory claimed in claim 1, wherein said second region includes said code ions implanted in accordance with a code for said semiconductor memory.

10. A semiconductor memory claimed in claim 1, wherein said plurality of bit lines is formed by implanting a first impurity to form N+ diffused regions in said semiconductor substrate.

11. A semiconductor memory claimed in claim 1, wherein said semiconductor substrate comprises P-type silicon substrate.

12. A semiconductor memory claimed in claim 10, wherein said first impurity comprises arsenic.

13. A semiconductor memory claimed in claim 1, wherein each of said plurality of word lines comprises a patterned polycide film including a polysilicon layer deposited on said first oxide film and doped with a second impurity and a silicide layer deposited on said polysilicon layer.

14. A semiconductor memory, comprising:
a plurality of bit lines formed on a substrate;
an oxide film formed over said plurality of bit lines and said substrate; and
a plurality of word lines, wherein
each of said plurality of bit lines has a first direction characteristic of a whole bit line that extends in a zigzag pattern, and
each of said plurality of word lines extends in a second direction that crosses said first direction.

15. A semiconductor memory claimed in claim 14, wherein
at a crossing of each of said plurality of bit lines with one of said plurality of word lines, a line segment of each of said plurality of bit lines is perpendicular to said one of said plurality of word lines, and
where another line segment of each of said plurality of bit lines does not cross one of said plurality of word lines, an acute angle to one of said plurality of word lines is formed.

16. A semiconductor memory claimed in claim 13, wherein said polysilicon layer is formed on said first oxide film by a chemical vapor deposition process.

17. A semiconductor memory claimed in claim 13, wherein said second impurity includes a high concentration of phosphorous.

18. A semiconductor memory claimed in claim 13, wherein said silicide comprises a silicide of a refractory metal.

19. A semiconductor memory claimed in claim 13, wherein said silicide is deposited on said polysilicon layer by sputtering.

* * * * *